United States Patent
Kirkman

(10) Patent No.: US 6,781,454 B1
(45) Date of Patent: Aug. 24, 2004

(54) LINEARIZED TRAVELING WAVE TUBE CIRCUIT WITH PRE-DISTORTION LINEARIZER

(75) Inventor: George F. Kirkman, Palos Verdes, CA (US)

(73) Assignee: Hughes Electronics Corporation, El Segundo, CA (US)

(*) Notice: Subject to any disclaimer, the term of this patent is extended or adjusted under 35 U.S.C. 154(b) by 69 days.

(21) Appl. No.: 09/615,019

(22) Filed: Jul. 13, 2000

(51) Int. Cl.[7] .............................. H03F 3/58; H03F 1/26
(52) U.S. Cl. .......................................... 330/43; 330/149
(58) Field of Search .......................... 330/43, 149, 284

(56) References Cited

U.S. PATENT DOCUMENTS

| | | | | |
|---|---|---|---|---|
| 4,701,717 A | * | 10/1987 | Radermacher et al. | 330/43 |
| 5,015,965 A | * | 5/1991 | Katz et al. | 330/149 |
| 5,291,148 A | * | 3/1994 | Reisner et al. | 330/149 |
| 5,430,568 A | * | 7/1995 | Little et al. | 398/81 |
| 5,523,716 A | * | 6/1996 | Grebliunas et al. | 330/149 |
| 5,617,059 A | * | 4/1997 | Eggleston | 330/189 |
| 5,703,531 A | * | 12/1997 | Vaughn et al. | 330/149 |
| 5,939,920 A | * | 8/1999 | Hiraizumi | 327/306 |
| 5,966,049 A | * | 10/1999 | Yuen et al. | 330/149 |
| 6,255,908 B1 | * | 7/2001 | Ghannouchi et al. | 330/149 |

* cited by examiner

*Primary Examiner*—Robert Pascal
*Assistant Examiner*—Khanh Van Nguyen
(74) *Attorney, Agent, or Firm*—Terje Gudmestad

(57) ABSTRACT

A traveling wave tube assembly has a traveling wave tube and a predistortion network RF coupled and physically coupled to the traveling wave tube. The traveling wave tube and the predistortion network may be located in a high temperature zone. An amplifier located in a low temperature zone, is coupled to the predistortion network by an RF connecting cable.

17 Claims, 5 Drawing Sheets

LINEARIZED TRAVELING WAVE TUBE CIRCUIT WITH PRE-DISTORTION LINEARIZER

TECHNICAL FIELD

The present invention relates generally to communication satellites, and more particularly, to a traveling wave tube circuit for communication satellites.

BACKGROUND ART

Traveling wave tube amplifiers, or traveling wave tubes as they are sometimes referred to, commonly consist of a vacuum tube RF high power amplifier. In most applications for space systems, the high power traveling wave tube amplifier is positioned some distance away from a predistortion linearizer and electronic power conditioner due to the differing operating temperature ranges of these devices. Commonly, the linearizer and power conditioner use solid state components and therefore require a lower operating temperature than the traveling wave tube amplifier. Commonly, an RF interconnecting cable is used to couple the traveling wave tube amplifier and the RF amplifiers and predistortion network. Such a device is shown in prior art FIG. 1 having an RF input 10 coupled to an RF amplifier 12 which in turn is coupled in series with a predistortion network 14. The predistortion network 14 is coupled to a second RF amplifier 16. The second RF amplifier 16 is coupled to the traveling wave tube amplifier 18 by an RF connecting cable 20. The RF amplifier 12, predistortion network 14 and RF amplifier 16 are located in a low temperature zone 22. The traveling wave tube 18 is positioned in a high temperature zone 24.

One problem with such a design is that the RF connecting cable 20 must be accounted for when performing an RF alignment of the linearizer with the traveling wave tube amplifier 18. When the alignment is completed with a specific cable length, any changes to the cable length may change the characteristics of the circuit and therefore the alignment process needs to be repeated.

Another drawback to the system is that the predistortion network is typically comprised of field effect transistors (FETs). These devices have limited operating range for reliable operation.

It would therefore be desirable to provide a traveling wave tube amplifier and predistortion network circuit integrated as a single unit that does not require alignment if the cable length is changed.

SUMMARY OF THE INVENTION

It would therefore be desirable to provide an improved traveling wave tube amplifier circuit that allows design flexibility for the spacecraft. It is a further object of the invention to provide a passive linearizer capable of operating at high temperatures to eliminate the effect of the RF connecting cable on the design of the circuit.

In one aspect of the invention, a traveling wave tube amplifier assembly has a traveling wave tube, a predistortion network coupled to the traveling wave tube and physically coupled to the traveling wave tube. An amplifier is separated from the traveling wave tube and the predistortion network by a connecting cable coupled to the amplifier and the predistortion network. In a preferred embodiment of the invention, the predistortion network and traveling wave tube are located in a high temperature zone and the RF amplifier is located in a lower temperature zone than the high temperature zone.

One advantage of the invention is that the cable length may be changed to accommodate various designs process without having to perform another alignment process.

Other objects and features of the present invention will become apparent when viewed in light of the detailed description of the preferred embodiment when taken in conjunction with the attached drawings and appended claims.

DETAILED DESCRIPTION OF THE INVENTION

Figure 1:
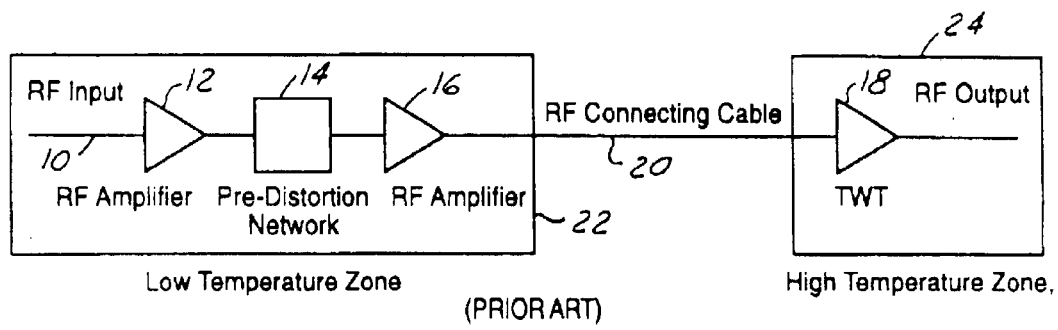
FIG. 1 is a schematic view of a prior art traveling wave tube amplifier circuit.

In the following description, the same reference numerals will be used to identify the same components in the various views. Although specific configurations are illustrated, those skilled in the art will recognize various alternative embodiments and configurations may be possible according to the teachings of the present invention.

Figure 2:
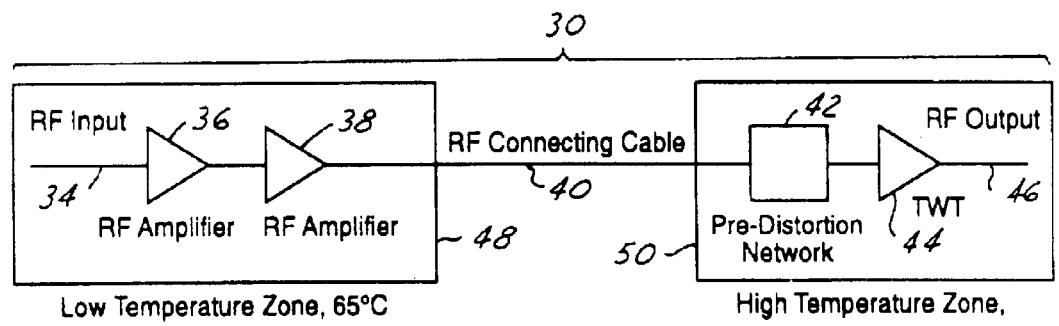
FIG. 2 is a schematic view of a traveling wave tube amplifier circuit according to the present invention.

Referring now to FIG. 2, although other uses are possible, the present invention is illustrated with respect to a spacecraft generally represented by reference numeral 30. Spacecraft 30 has a traveling, wave tube amplifier circuit 32 according to the present invention. The circuit 32 has an RF input 34 that is coupled to a first RF amplifier 36. The first RF amplifier 36 has an output coupled to a second RF amplifier 38. Although two RF amplifiers are illustrated, those skilled in the art will recognize that a combination amplifier having the features of RF amplifier 36 and RF amplifier 38 may be formed.

An RF connecting cable 40 is coupled to the output of RF amplifier 38. RF connecting cable 40 couples RF amplifier 38 to a predistortion network 42. The predistortion network 42 is coupled physically to traveling wave tube amplifier 44. Also, the predistortion network 42 is coupled electrically in series with traveling wave tube 44 and the output of RF amplifier 38. The traveling wave tube 44 has an RF output 46.

RF amplifiers 36 and 38 are located in a low temperature zone 48 and predistortion network 42 and traveling wave tube 44 are located in a high temperature zone. For example, the low temperature zone may be about 65° C. High temperature zone 50 may, for example, be about 85° C. Thus, the predistortion network 42 is separated from the components for RF amplification, namely the first RF amplifier 36 and the second RF amplifier 38.

Traveling wave tube amplifier 44 is preferably a vacuum tube high power amplifier. The traveling wave tube is a high power amplifier and operates efficiently at a high operating temperature such as the high temperature zone 50.

Figure 3:
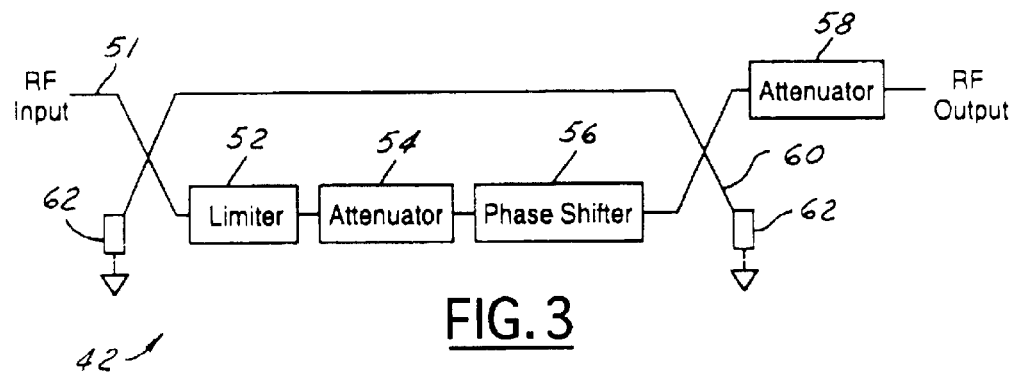
FIG. 3 is a schematic view of a predistortion network of FIG. 2

Referring now to FIG. 3, the predistortion network 42 is illustrated having an RF input 51, a limiter 52 coupled in series with the RF input. Limiter 52 is coupled in series with a first attenuator 54. The first attenuator 54 is coupled in series with a phase shifter 56 and the phase shifter 56 is coupled in series with a second attenuator 58. The operation of the limiter 52. attenuator 54, phase shifter 56, and attenuator 58 are well known in the art. Also, the predistortion network 42 has a transmission line 60 coupled in parallel with a series connection of limiter 52, attenuator 54, and phase shifter 56. Both ends of transmission line 60 are coupled to a ground termination 62. Predistortion network 42 is preferably formed of robust components such as PIN diodes that operate at higher temperatures than the field effect transistors (FETs). Advantageously, the predistortion network 42 may be located with the traveling wave tube 44 and the high temperature zone 50 that allows the independence of the circuit and the alignment process on the RF connecting cable 40.

Figure 4:
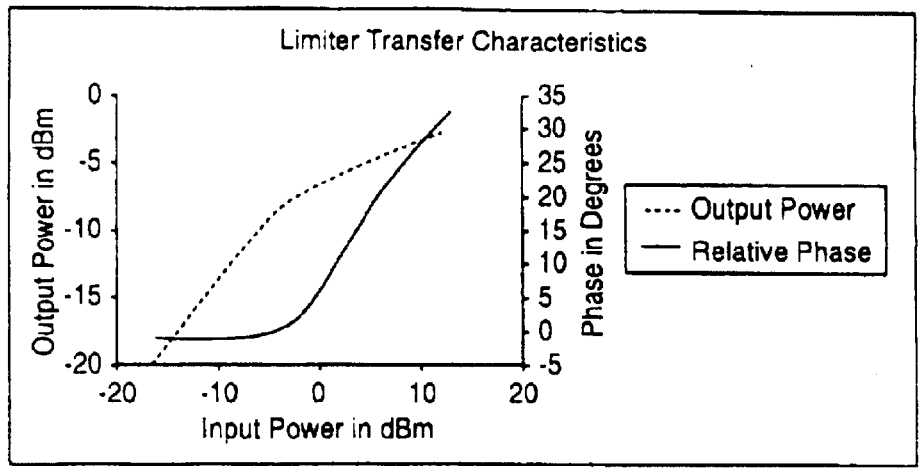
FIG. 4 is a output power versus input power of the circuit of FIG. 3.

Referring now to FIG. 4, the transfer characteristic of the first limiter 52 is illustrated. As those skilled in the art will recognize, the transfer characteristics of the limiter 52 has power levels suitable for inputs to a traveling wave to amplifier. This eliminates the need for amplification stage 16 between the predistortion network and the traveling wave tube. As illustrated, the relative phase is plotted with respect to output power. The bold line is relative phase; and, the thin line is output power. The elimination of amplifier stage 16 allows for operation at high temperature.

Figure 5:
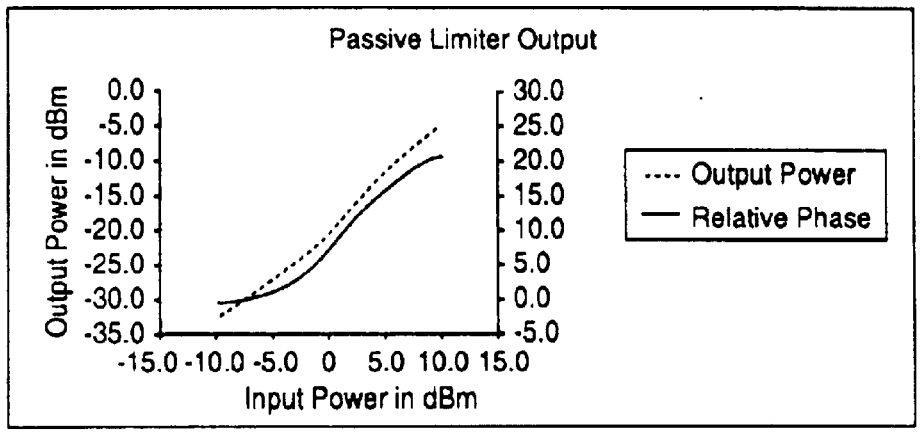
FIG. 5 is a plot of the circuit of FIG. 3 used in FIG. 2 illustrating output power versus input power.

Referring now to FIG. 5, when a linearizer having the transfer characteristics shown in FIG. 4 is used in the circuit of FIG. 3, the output of predistortion network 42 shown in FIG. 5 may be obtained.

Figure 6:
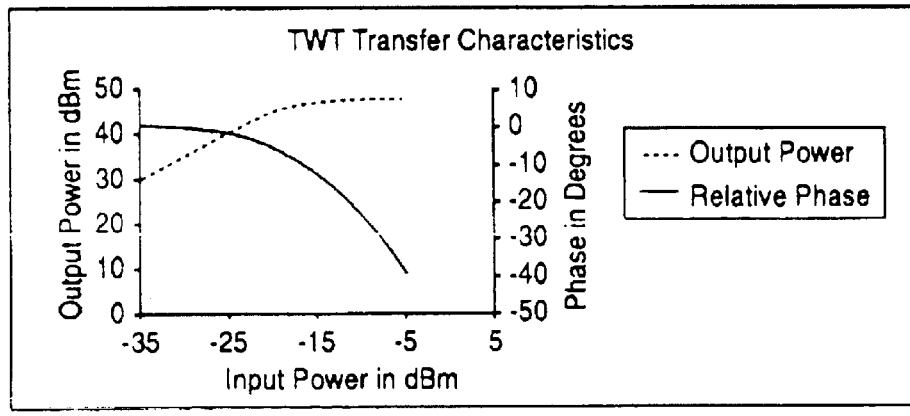
FIG. 6 is transfer characteristic for a traveling wave tube showing output power versus input power.

Referring now to FIG. 6, a transfer characteristic of a suitable traveling wave tube is shown. Both output power and relative phase are illustrated.

Figure 7:
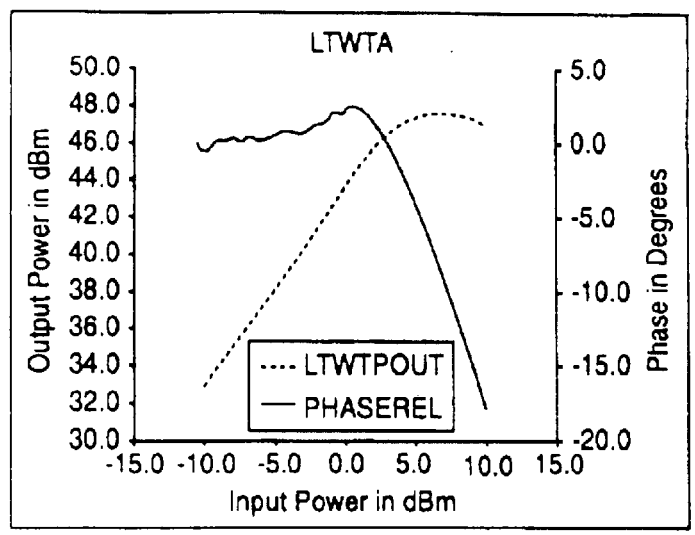
FIG. 7 is an output versus input power plot of a linearized traveling wave tube using the circuit of FIG. 3 and the transfer characteristics of FIG. 6.

Referring now to FIG. 7, when the traveling wave tube transfer characteristic shown is combined with the linearizer having a transfer characteristic shown in FIG. 5, the traveling wave tube amplifier 32 is illustrated in FIG. 7.

Figure 8A:
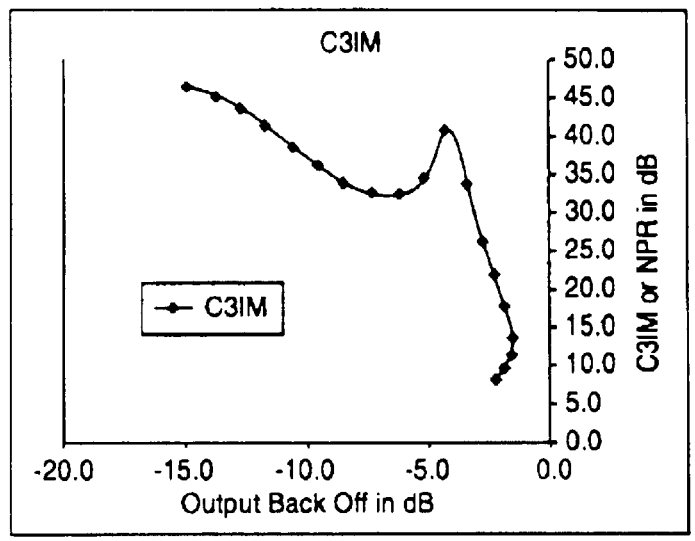
FIG. 8A is a plot of C/3IM or NPR plot versus output backoff that illustrates the linearized traveling wave tube characteristic of the circuit of FIG. 7.
Figure 8B:
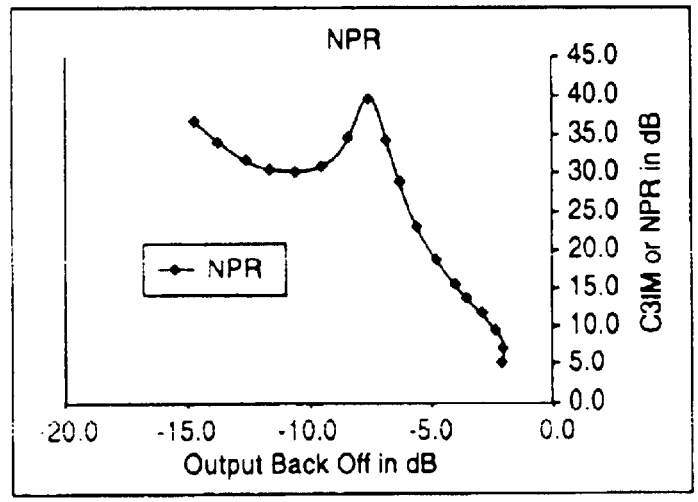
FIG. 8B is a plot of NPR versus output backoff of the circuit plotted in FIG. 7.

Referring now to FIGS. 8a and 8b, a traveling wave tube amplifier circuit performance is shown. In FIG. 8a, the C3IM performance is illustrated for the amplifier circuit having the transfer characteristics shown in FIG. 7. Also, FIG. 8b illustrates the NPR transfer characteristics.

Figure 9:
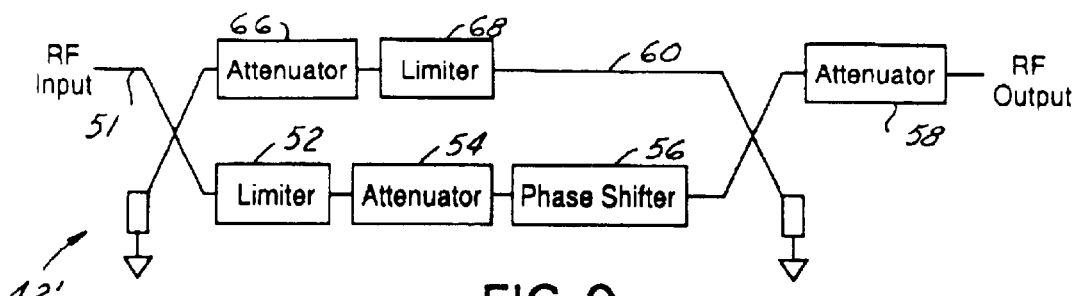
FIG. 9 is a schematic view of an alternative predistortion network according to the present invention.

Referring now to FIG. 9, the same reference numerals are used to illustrate the same components of FIG. 3. An alternative embodiment of a predistortion network 42' is illustrated. In a similar manner to that shown in FIG. 3, an RF input 41 is coupled with the series combination of a first limiter 52 and a first attenuator 54, a phase shifter 56 and a second attenuator 58. In addition, the transmission line 60 has a third attenuator 66 coupled in series with a second limiter 68. An attenuation of 5.5 dB for third attenuator 66 was used in the predistortion network. Adjustment of the attenuator will allow the network 42' to be used with a family of different traveling wave tubes with input powers that vary ±2.5 dB.

Figure 10:
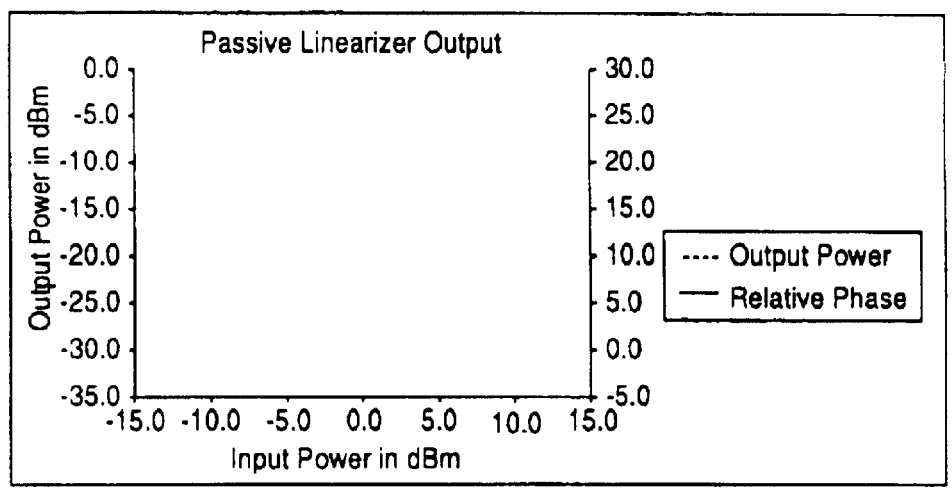
FIG. 10 is an output power versus input power transfer characteristic of the circuit of FIG. 9.

Referring now to FIG. 10, the transfer characteristic of the predistortion network 42' is illustrated.

Figure 11:
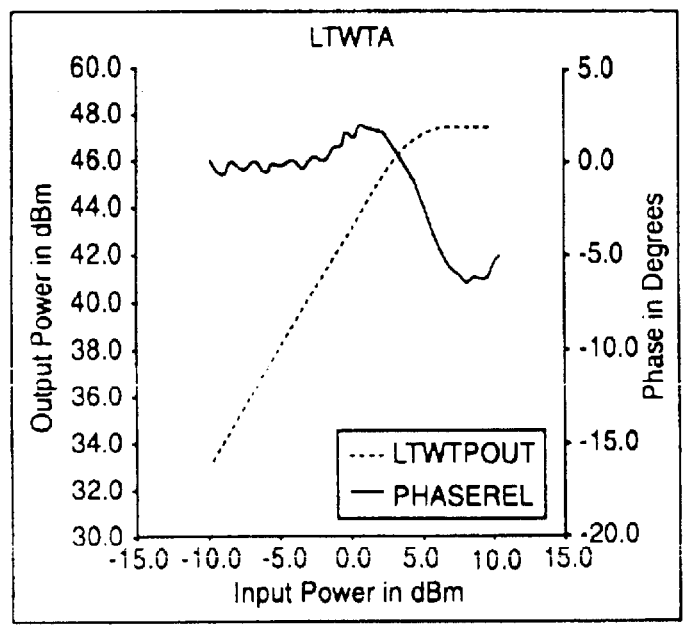
FIG. 11 is a transfer characteristic plot showing output power versus input power using the predistortion network of FIG. 9 with a traveling wave tube having the characteristics of FIG. 6.

Referring now to FIG. 11, the transfer characteristic of the traveling wave tube amplifier circuit 32 having a predistortion network 42' and a traveling wave tube characteristic 56 is illustrated.

Figure 12A:
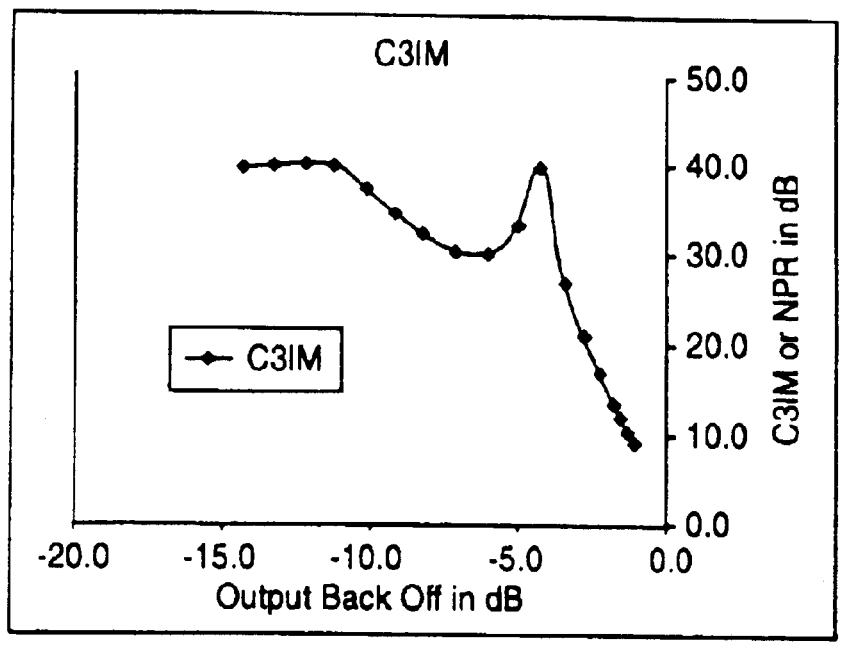
FIG. 12A is a plot of C/3IM performance of the traveling wave tube circuit of FIG. 11.
Figure 12B:
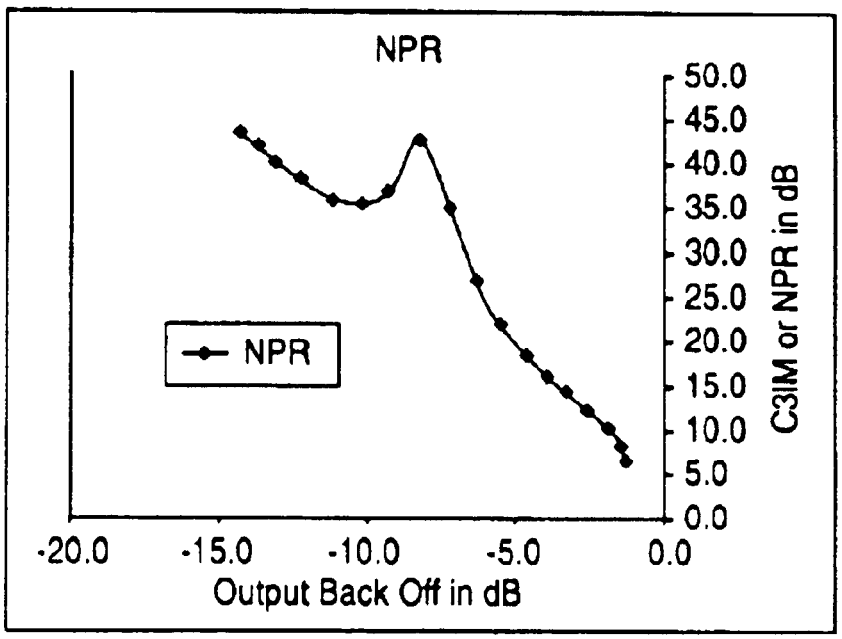
FIG. 12B is a plot of NPR versus output backoff showing the NPR performance of the linearized traveling wave tube circuit of FIG. 11.

Referring now to FIGS. 12A and 12B, the performance of the traveling wave tube amplifier circuit having a predistortion network 42' is illustrate. In FIG. 12A, the C3IM performance is illustrated. In FIG. 12B. the NPR transfer characteristic is illustrated.

In operation, because the predistortion network 42 is capable of being located within high temperature zone 50, the alignment process of the circuit is considerably reduced. Thus, once the circuit is formed and the alignment is performed, no further alignments are required if the length of the RF connecting cable is changed.

While particular embodiments of the invention have been shown and described, numerous variations alternate embodiments will occur to those skilled in the art. Accordingly, it is intended that the invention be limited only in terms of the appended claims.

What is claimed is:

1. A traveling wave tube circuit assembly comprising a traveling wave tube:
   a predistortion network coupled to the traveling wave tube, said predistortion network disposed in a high temperature zone;
   an amplifier;
   a connecting cable coupling the amplifier to the predistortion network.

2. An assembler as recited in claim 1, wherein said amplifier is disposed in a low temperature zone.

3. An assembly as recited in claim 1, wherein said predistortion network comprises a limiter.

4. An assemble as recited in claim 1, wherein said predistortion network comprises:
   a first limiter;
   a first attenuator coupled in series with said first limiter; and
   a phase shifter coupled in series with said first attenuator.

5. An assembly as recited in claim 4, wherein said predistortion network further comprises a second attenuator coupled in said series with said phase shifter.

6. An assembly as recited in claim 4, wherein said predistortion network further comprises a transmission line coupled parallel to said limiter, said first attenuator and said phase shifter.

7. An assembly as recited in claim 6, wherein said transmission line has a third attenuator.

8. An assembly as recited in claim 7, wherein said predistortion network further comprises a second limiter coupled in series with said third attenuator.

9. An assembly as recited in claim 1, further comprising a second amplifier coupled in series with said first amplifier.

10. A traveling wave tube circuit assembly comprising:
a high temperature zone having a predistortion network; and
a traveling wave tube coupled in series with the predistortion network;
a low temperature zone having an RF amplifier; and
an RF connecting cable coupling said low temperature zone and said high temperature zone.

11. An assembly as recited in claim 10, wherein said predistortion network comprises:
a first limiter;
a first attenuator coupled in series with said first limiter; and
a phase shifter coupled in series with said first attenuator.

12. An assembly as recited in claim 10, wherein said predistortion network further comprises a second attenuator coupled in said series with said phase shifter.

13. An assembly as recited in claim 10, wherein said predistortion network further comprises a transmission line coupled parallel to said limiter, said first attenuator and said phase shifter.

14. An assembly as recited in claim 10, wherein said transmission line has a third attenuator.

15. An assembly as recited in claim 10, wherein said predistortion network further comprises a second limiter coupled in series with said third attenuator.

16. An assembly as recited in claim 10 further comprising a second RF amplifier coupled in series with said first RF amplifier.

17. A satellite comprising:
a high temperature zone having a predistortion network; and
a traveling wave tube coupled in series with the predistortion network;
a low temperature zone having an RF amplifier; and
an RF connecting cable coupling said low temperature zone and said high temperature zone.

* * * * *